United States Patent [19]

Melcher et al.

[11] 4,379,022

[45] Apr. 5, 1983

[54] METHOD FOR MASKLESS CHEMICAL MACHINING

[75] Inventors: Robert L. Melcher, Yorktown Heights; Lubomyr T. Romankiw, Briarcliff Manor; Robert J. Von Gutfeld, New York, all of N.Y.

[73] Assignee: International Business Machines Corporation, Armonk, N.Y.

[21] Appl. No.: 170,472

[22] Filed: Jul. 21, 1980

Related U.S. Application Data

[62] Division of Ser. No. 37,074, May 8, 1979, Pat. No. 4,283,259.

[51] Int. Cl.³ ............................................... C23F 1/02
[52] U.S. Cl. .................................... 156/643; 156/345; 156/656; 219/121 LH; 252/79.2
[58] Field of Search ............... 219/121 LH, 121 LJ, 219/121 LM; 252/79.2, 79.4, 79.5; 156/635, 643, 628, 654, 656, 664, 655, 662, 345; 430/297, 299, 323; 204/129.3; 148/9.5

[56] References Cited

U.S. PATENT DOCUMENTS

| | | | |
|---|---|---|---|
| 2,744,859 | 5/1956 | Rines | 204/15 |
| 3,296,359 | 1/1967 | Ramsey et al. | 174/68.5 |
| 3,364,087 | 1/1968 | Solomon et al. | 156/635 |
| 3,482,975 | 12/1969 | Schaefer | 430/297 |
| 3,506,545 | 4/1970 | Garwin et al. | 204/15 |
| 3,520,687 | 7/1970 | Schaefer | 430/297 |
| 3,530,053 | 9/1970 | Scott et al. | 204/157.1 |
| 3,706,645 | 12/1972 | Lasser | 204/129.3 |
| 3,762,938 | 10/1973 | Ridenour et al. | 117/63 |
| 3,772,056 | 11/1973 | Polichette | 117/47 |
| 3,772,078 | 11/1973 | Polichette et al. | 116/212 |
| 3,775,157 | 11/1973 | Fromson | 117/71 |
| 3,839,083 | 10/1974 | Sihvonen et al. | 117/212 |
| 3,993,802 | 11/1976 | Polichette et al. | 427/98 |
| 3,994,727 | 11/1976 | Polichette et al. | 96/38.4 |
| 4,024,029 | 5/1977 | Rain et al. | 204/15 |
| 4,063,063 | 12/1977 | Funck et al. | 148/9.5 X |
| 4,072,768 | 2/1978 | Fraser | 427/34 |
| 4,133,908 | 1/1979 | Madsen | 427/53 |
| 4,239,789 | 12/1980 | Blum et al. | 427/53.1 |

FOREIGN PATENT DOCUMENTS

| | | | |
|---|---|---|---|
| 2348182 | 4/1975 | Fed. Rep. of Germany | 204/15 |
| 1295071 | 4/1962 | France | 204/15 |
| 2245784 | 4/1975 | France . | |
| 2300632 | 9/1976 | France . | |
| 233876 | 7/1977 | France . | |
| 52-70498 | 6/1977 | Japan | 219/121 LJ |
| 54-38770 | 3/1979 | Japan | 156/345 |
| 847927 | 9/1960 | United Kingdom | 156/655 |

*Primary Examiner*—William Powell
*Attorney, Agent, or Firm*—Michael J. Weins; Graham S. Jones, II

[57] ABSTRACT

A method for high resolution maskless chemical and electrochemical machining is described. Preferential etching results from exposing those regions where machining is sought to an energy beam. Such exposures can increase the etching rate in the case of electrochemical machining by a factor of $10^3$ to $10^4$. Such enhancement is sufficient to make masking unnecessary.

10 Claims, 2 Drawing Figures

METHOD FOR MASKLESS CHEMICAL MACHINING

This case is a division of an application, Ser. No. 037,074 filed May 8, 1979, U.S. Pat. No. 4,283,259.

DESCRIPTION

1. Technical Field

This invention relates generally to a method for enhancing the rate of chemical and electrochemical machining, more particularly to a maskless technique employing an energy beam to establish high resolution chemical and electrochemical machined patterns.

2. Background Art

The classical methods of machining which rely on deformation mechanisms are limited in their resolution and result in deformation of the machined surface. The problems associated with deformation of the machined surface have in part been overcome by electrochemical machining techniques.

W. Kern and J. M. Shaw, in Journal of Electrochemical Society, Electrochemical Technology, Vol. 118, No. 10, pp. 1699–1704 disclose a technique for delineation of high resolution patterns in tungsten films on semiconductor device wafers. Their process is based on high speed anodic dissolution of tungsten. In order for the dissolution to be preferential, it is necessary to employ a photoresist mask which is applied before machining the surface. The photoresist is selectively exposed to develop a pattern, the exposed surface is electrochemically machined, and finally the mask is stripped. This multistep process is time consuming and costly.

Maskless techniques for electrochemical machining are available. These techniques employ a shaped cathode brought in close proximity to the workpiece, which serves as the anode. A flowing salt solution serves as the electrolyte between the cathode and the workpiece. As a voltage is applied to make the workpiece anodic with respect to the cathode, metal ions from the workpiece are preferentially transferred to the liquid in the vicinity of the cathode. As the contour of the workpiece changes, the cathode is advanced to maintain its proximity to the workpiece. This technique is suited for sinking shallow axially symmetric cavities into a surface, but is limited with respect to the configurations that may be generated or to the dimensional lower limits which can be achieved. Due to the need of flowing the electrolyte at high speeds past the surface to carry away the insoluble products of reaction and to cool the part and the solution high pressure, high capacity pumps are an essential part of the equipment. Maskless electrochemical machining techniques are further described by J. F. Thorpe and R. D. Zerkle, in an article entitled "A Theoretical Analysis of the Equilibrium Sinking of Shallow, Axially Symmetric Cavities by Electrochemical Machining," and by W. Konig and H. Degenhardt in an article entitled "The Influence of Process Parameters and Tool-Electrode Geometry on the Development of the Overcut in Electrochemical Machining with High Current Densities". Both articles are published in Fundamentals of Electrochemical Machining, (1971) Editor C. L. Faust, Electrochemical Society, Princeton, New Jersey.

A jet stream technique discussed by J. L. Bestel, J. K. Dorey, II, D. J. Fineberg, R. Haynes, K. Ramachandran, R. E. Sinitski and V. Srinivasan in Electrochemical Society, Abstract, 286, Vol. 77, No. 2, page 759 (1977), offers an alternative method for maskless plating which would also be applicable to maskless electrochemical machining. To machine, a stream or jet of electrolyte impinges on the workpiece, and the stream is maintained at a lower electrical potential than the workpiece. Since the workpiece is anodic with respect to the stream, metal ions will be transferred to the stream from the workpiece resulting in selective etching.

Gerald C. Oliver in an article entitled "Plating Fine Lines with a Nozzle," in Insulation/Circuits, p. 23-4 (July 1978), points out that jet plating and etching will allow one to obtain resolution of 100 microns or less with present nozzles and that with nozzle openings in the micron range a line pattern of resolution approaching the dimension of the nozzle openings is achievable. While Oliver suggests that it may be possible to plate patterns in the micron range, it should be pointed out that employing micron diameter nozzles for plating or etching will increase the frequency of the clogging of the nozzles and can result in the streams which exist from these nozzles being discontinuous.

Laser machining will produce fine holes. Since laser machining is accomplished by either melting or vaporizing the material removed, the substrate will be locally heated. This heating can cause changes in the microstructure and introduce residual stresses and cracks in the resulting machined surface. The melting or vaporization can also reduce edge definition of the machined holes. These problems associated with laser machining are further discussed in an article entitled, "Effect of Pulsed Laser Radiation on Thin Aluminum Foils" by M. O. Aboelfotoh and R. J. von Gutfeld, in the Journal of Applied Physics, Vol. 43, No. 9, pages 3789–94 (1972).

Light activated plating which is the converse process to electrochemical machining has been employed to produce arbitrary patterns by plating onto a photoconductor exposed to light. C. S. Roberts in U.S. Pat. No. 3,013,955 teaches exposing doped regions of silicon to light producing a photovoltaic effect which promotes plating in the doped regions exposed to light.

P. F. Schmidt in U.S. Pat. No. 3,345,274 and P. F. Schmidt et al in U.S. Pat. No. 3,345,275 teaches the anodization of a photoconductor substrate by exposing to light those areas which are to be anodized.

Similarly G. Suzuki and T. Tomotsu in U.S. Pat. No. 3,935,117 describe a photosensitive compound which can be decomposed by light to form etching solutions.

While the Roberts, Schmidt and the Schmidt et al techniques teach methods of forming preferential patterns on substrates by exposing the substrate or portions thereof to light, these techniques are limited to photoconducting substrates and do not teach enhancement of the plating rate as a function of the strength of the light source. The same limitation applies to the etching technique of Suzuki et al with respect to the etchant that can be employed.

DISCLOSURE OF INVENTION

An object of the present invention is to establish a method for maskless chemical and electrochemical machining. Another object of this invention is to provide a method for machining that is suitable for personalization of integrated circuits and circuit boards. Still another object of this invention is to provide a method for machining contours or arbitrary shapes. Various other objects and advantages of the present invention will become apparent to those skilled in the art from the following description and suggested industrial applications.

The practice of the present invention allows one to chemically machine a surface without masking. The surface to be machined is contacted with an etching solution. An energy source is focused onto the workpiece where it locally heats the surface to be machined. This process locally speeds up the chemical reaction and enhances the etching rate and preferentially removes material from the heated surface.

Alternatively, the present invention may be practiced by contacting the surface to be machined with an electrolyte in which a cathode is placed. Again an energy source is focused onto the workpiece where it locally heats the surface to be machined. An electric potential is established between the surface of the workpiece, serving as the anode, and the cathode.

BEST MODES FOR CARRYING OUT THE INVENTION

There are two modes for practicing the present invention: energy beam assisted chemical machining, and energy beam assisted electrochemical machining.

Figure 1:
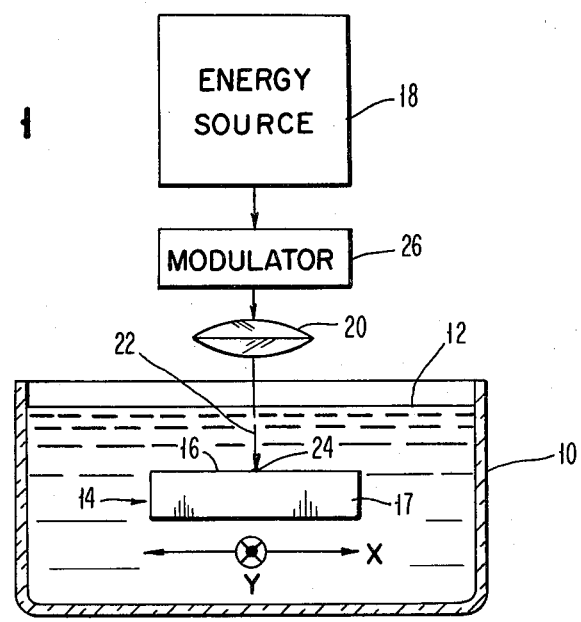
FIG. 1 illustrates one embodiment of the invention which employs an energy beam to assist in chemical machining.

The practice of the first mode, energy beam assisted chemical machining, will be described in terms of FIG. 1. There is shown in FIG. 1 a vessel 10 which contains an etching solution 12. The workpiece 14 is immersed in the etching solution 12 so as to cause the surface 16 which is to be chemically machined to be contacted by the electrolyte 12. While the workpiece 14 has been illustrated with the machined surface 16 being horizontal, the surface 16 may be placed in a vertical position or any other convenient position. The etching solution may be either acidic or alkaline. However, in either case an etching solution should be chosen which at room temperature exhibits only a very slow etching rate on the workpiece and which attacks the surface 16 of the workpiece 14 very uniformly, i.e. not preferred intergranular attack.

Typically for metals such as Ni, Cu, Al, an acid etching solution such as $NHO_3$, $HCl$, and $H_3PO_4$ would be appropriate.

When the workpiece 14 is submerged in the solution 12 etching will occur at a nominal or background rate on all exposed faces including the surface 16. An energy source 18 is focused by a lens system 20 to concentrate the energy in the beam 22 which passes through the etching solution 12 and impinges on the surface 16. An energy source 18 which generates electromagnetic radiation in the visible or infrared spectrum is particularly useful since a wavelength can be selected so as not to be strongly absorbed by the etching solution 12 and yet still be strongly absorbed by the workpiece 14. When it is desired to machine holes which are not greater than $100\mu$ in diameter through the entire thickness of the workpiece 14, it is preferred to maintain the workpiece's thickness to approximately 5 mil. or less. This will assure mixing of the etching solution in the machined recesses with the bulk solution.

Figure 2:
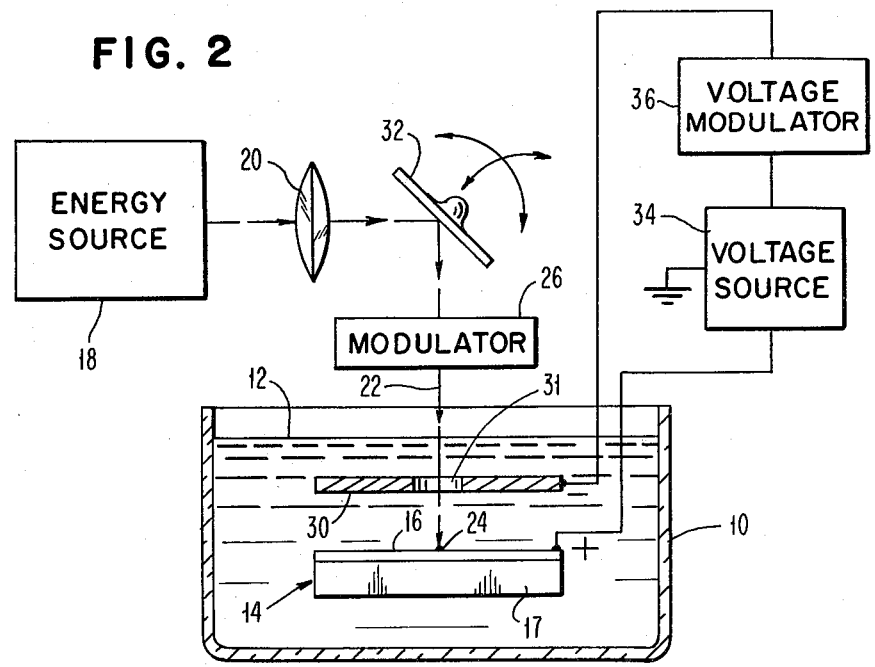
FIG. 2 illustrates a second embodiment of the invention which employs an energy beam to assist in electrochemical machining.

This technique of chemical machining is particularly well suited for a workpiece 14 which is a composite, in which the machined surface 16 is a strongly optical absorbing material such as a metal, and the substrate 17 is a material with a low thermal conductivity such as glass. This configuration of the workpiece 14 is illustrated in FIG. 2. This composite structure will enhance the localization of the heat effected zone and thereby increase the preferential etching in the heated regions. Again, for the reasons discussed above the metallized surface 16 should be thin, preferably less than 5 mil when holes having a diameter of less than $100\mu$ are desired.

The beam 22 exposes the region 24 locally heating that portion of the surface 16 where machining is sought. The region 24 exposed and heated by the beam 22 may be so manipulated by moving the workpiece 14 in the x and the y directions as shown in FIG. 1. Alternatively, it is possible to maintain the workpiece 14 stationary and manipulate the beam 22.

When electromagnetic radiation in the visible range is employed it can be generated from a carbon arc but preferably a laser light source such as a continuous light from a multimode argon laser or krypton tunable laser is desired. The laser provides a high intensity energy source 18 which may eliminate the necessity of a lens system 20 unless further focusing is desired to reduce the beam size 22. The intensity of the light in all cases should be sufficient to provide a beam 22 with an intensity preferably between about $10^2$ to $10^6$ W/cm$^2$.

The lower limit is required to provide sufficient heating for enhancement of the etching rate, while the upper limit should be chosen to avoid thermotransformation of the structure of the work piece. In general, this will limit the maximum power input to about $10^6$ W/cm$^2$. When a beam 22 passes through the etching solution 12 care must be taken in selecting the wavelength of the light to avoid a frequency that is strongly absorbed by the etching solution 12.

Alternative etching arrangements are available where the beam 22 need not pass through the etching solution 12. If for example, only the surface 16 of the workpiece 14 is brought in contact with the etching solution 12, the beam 22 may expose the workpiece 14 on the side opposite the surface 16, which is where machining is sought. When the workpiece 14 in the vicinity to be machined is not greater than about 5 mil in thickness it is possible to generate sharp temperature profiles through the workpiece 14, and thereby establish temperature contours in the surface 16 similar to the contours that would result from passing the beam 22 through the etching solution 12 and directly expose the surface 16.

The same technique can be used for a thicker workpiece 14 which has a strongly absorbing surface 16 which typically could be a metal and a substrate 17 which is transparent to the radiation. In this case, it is preferred that the metallized coating be generally less than 5 mil. for holes less than approximately $100\mu$.

The beam 22 emitted from the energy source 18 may be modulated by a modulator 26 which may be placed between the energy source 18 and the lens system 20, or alternatively between the lens system 20 and the workpiece 14. The modulator 26 may be a mechanical light chopper when the modulation rate is low or an optical modulator can be employed when more rapid modulation is sought. Optical modulation will allow frequencies up to gigahertz.

Preferential etching will occur in the region 24 heated by the impinging light. Modulating or pulsing of the light provides sharper temperature profiles in the vicinity of the light exposed region 24, and enhances the etching rate and improves the edge definition.

Modulation of the laser light has the effect of limiting the thermal spread which occurs in the substrate through thermal conduction and causes a decrease in the resolution.

The practice of the second mode, electrochemical machining, will be described in reference to FIG. 2. There is shown in FIG. 2 a vessel 10 which contains an electrolyte 12.

Typically for a metal such as Cr, Ni or Ti an electrolyte such as NaCl solution would be appropriate.

The workpiece 14 is immersed in the electrolyte 12. The workpiece 14 for this mode must be conducting and may be a metal, photoconductor or a composite structure of an insulator and an electrical conductor. When a composite structure is employed having an electrically nonconducting substrate it is preferred that the thickness of the metallized surface 16 be less than 5 mil. A cathode 30 is placed in the electrolyte 12 and is spaced apart from the workpiece 14, which serves as an anode. An energy source 18 is focussed by a lens system 20 to form a beam 22 which passes through an opening 31 in the cathode 30 and exposes the region 24 of the surface to be machined 16. When a laser is employed as the energy source 18 the lens system 20 may be optional. As heretofore described for the first mode the beam 22 may be manipulated with respect to the machined surface 16 by movement of the workpiece 14 as illustrated in FIG. 1 or alternatively the beam 22 may be manipulated via a scanning mirror 32 allowing a predetermined portion of the surface 16 of the workpiece 14 to be exposed.

Alternative etching schemes are available where the beam 22 is not passed through the electrolyte 12. These schemes in all respects are similar to those earlier discussed for chemical machining. A voltage source 34 is connected between the workpiece 14 and the cathode 30, which is maintained at negative potential with respect to the workpiece 14.

Again, the beam 22 may be modulated by a voltage modulator 36 to sharpen the temperature profile in the light exposed region 24 and enhance the resolution of the machining. A voltage modulator 36 may be employed to synchronize the application of the electrical potential to the modulated light. Synchronization of the laser beam 22 and the etching voltage has the advantage that etching is allowed to occur only when the laser has locally heated the substrate to produce the optimal temperature gradient. At other times during the modulation cycle the etching voltage is turned off thus reducing the background etching.

When the voltage is applied as described above metallic ions pass into the electrolyte 12 from the workpiece 14. While there will be a general transport of ions from the workpiece 14 into the electrolyte, preferential solutioning of the ions will occur in the region 24 heated by the impinging light. By appropriately pulsing the light and pulsing the voltage in synchronism it is possible to obtain etching rates of approximately $10^4$ times greater than the background rate, thus negating the requirement of masking in order to establish etched patterns in the surface of a substrate.

While all modes of the present invention have been described in terms of a single beam 22 impinging on the workpiece 14 one could employ multiple beams and simultaneously etch at multiple locations.

The following specific examples of the invention give details and are by way of illustration and not by way of limitation.

EXAMPLE I

A 304 stainless steel workpiece and a Pt cathode are placed in a nickel chloride etching solution. The solution has the following composition:

12 gm Ni $Cl_2.6H_2O$
25 gm $H_3BO_3$
1.64 gm Na-Saccharine
1.0 gm 2 butyne 1-4 diol
1 l $H_2O$ The surface of the workpiece is adjacent to, but separated from the cathode and has an area of approximately 0.3 $cm^2$. The anode and the cathode are maintained at constant potential difference. A current between the cathode and the anode of ∼1 ma is established which yields a current density of 3.3 ma/$cm^2$. A focussed argon laser is employed to generate a beam having an energy density of $3\times10^5$ W/$cm^2$ which exposes a circular region of the surface approximately 50$\mu$ in diameter. The length pulse is 20 ms. The time between pulses is 60 ms. During the laser pulse the current increases to ∼2 ma. The laser enhanced current density normalized over the exposed circular region is $5.0\times10^4$ ma/$cm^2$. As can be seen the laser associated increase in the current, which is directly related to the etching rate, is a factor of approximately $1.5\times10^4$.

EXAMPLE II

When 304 stainless steel stock 2 mil thick is placed in the electrolyte and exposed as set forth in Example I, holes which passed through the stock are produced when a potential difference between the anode and cathode of 1.5 V is applied. In a total elapsed time of approximately 9 sec, holes having sharp edge definition and diameter between 25 & 50$\mu$ are produced. These holes are produced without otherwise damaging the steel stock.

EXAMPLE III

A 304 stainless steel stock which in this case is 20 mil in thickness is placed in the electrolyte of Examples I and II. Again the same potential is applied as for the examples above. An argon laser is employed. The beam is focused to 150$\mu$ diameter giving a beam density of about $2\times10^3$ W/$cm^2$. Light enhanced etching of holes was conducted for various periods of continuous light exposure and the data are tabulated below.

| Time of exposure | Depth of hole | ∼ diameter of hole |
| --- | --- | --- |
| 2.5 | 4.8$\mu$ | 160$\mu$ |
| 5.0 | 8.0$\mu$ | 160$\mu$ |
| 10.0 | 16.0$\mu$ | 175$\mu$ |
| 15.0 | 18.3$\mu$ | 175$\mu$ |

It can be seen that by increasing the exposure time, one increases the machining depth.

EXAMPLE IV

A 304 stainless steel sample having the geometry of Example III is exposed to a beam as described in Example III. Again a potential of 1.5 V is applied between the anode and cathode. In this case, the beam is pulsed with the light being on for 44 ms and off for 130 ms a hole having a depth of 18μ, a diameter of 115μ is etched. Comparing Examples III & IV one can see that by pulsing the beam the resolution of the etching can be improved.

EXAMPLE V

Workpiece is glass with a 1000 Å Ni film deposited on its surface. The workpiece is placed in a solution consisting of:

20 gm NaCl
2.5 ml concentrated $H_2SO_4$
125 ml $H_2O$

The Ni film is maintained using ~700 mW of light from a krypton laser turned to 6471 Å, the incident light is focussed on 16 to a spot ~170μ in diameter ($3 \times 10^3$ $W/cm^2$). Holes in the film are produced where light is allowed to impinge for times of the order of 1-5 sec. a thinning of the film to approximately half its thickness is observed along the beam path when the film is moved in the Y direction at a rate ~2 mm/sec. When the acid solution is replaced by water and the experiment is repeated, no effect on the film is observed.

Industrial Applicability

The above described methods for chemical machining and electrochemical machining are well suited to application where maskless high resolution chemical and electrochemical machining is desired. The technique is well suited for hole drilling, personalization and repair of integrated circuits. The technique can also be used for circuit formation by etching particularly in which the area of metal removed is smaller than that of the metal remaining behind. The techniques described should be useful in the electronics packaging and related industries.

While the novel features of the invention have been described in terms of preferred embodiments and for particular industrial applications, it will be understood that the various omissions and substitutions in the form and details of the method described may be made by those skilled in the art without departing from the spirit of the invention.

Having thus described our invention, what we claim as new, and desire to secure by Letters Patent is:

1. A method of masklessly producing machined patterns by preferential chemical machining of regions of a surface of a workpiece comprising the following steps:
    contacting the surface with a chemical machining etching solution; and directing an
    energy beam having an intensity in the range from about $10^2$ $W/cm^2$ to about $10^6$ $W/cm^2$ onto the workpiece of sufficient intensity to heat only said regions of said surface to be machined locally with said surface in contact with said etching solution to promote enhanced etching of the surface to provide preferentially machined patterns in said regions heated by said beam where preferential machining is sought.

2. The method of claim 1 wherein said beam is laser generated.

3. A method of chemically machining a surface of a workpiece preferentially, said method comprising the following steps:
    immersing said surface in a chemical machining etching solution; and
    directing a laser beam onto regions comprising a pattern to be formed on said workpiece to be machined, said beam having an intensity in the range from about $10^2$ $W/cm^2$ to about $10^6$ $W/cm^2$ sufficient to locally heat regions of the surface in a pattern and to promote enhanced etching of the surface in the pattern formed by said regions where preferential machining is sought.

4. The method of claim 2 or 3 wherein said beam is modulated.

5. The method of claim 2 or 3 wherein the thickness of the workpiece at the surface to be machined is not greater than 5 mil and said etching solution is alkaline.

6. The method of claim 2 or 3 wherein the thickness of the workpiece at the surface to be machined is not greater than 5 mil thickness and said etching solution is acidic.

7. A method for masklessly producing machined patterns by preferential chemical machining of regions of a surface by contacting the surface with a chemical machining etching solution, the improvement comprising:
    directing a light beam onto said regions of said surface while said surface is in contact with said etching solution, said light beam having an intensity of greater than about $10^2$ $W/cm^2$ to heat only said regions of said surface to provide preferentially machined patterns to be machined by said solution in order to increase the etching rate in said regions heated by said beam where preferential machining is sought.

8. A method for chemical machining regions of a surface by contacting the surface with a chemical machining etching solution, the improvement comprising:
    immersing said surface in said etching solution, directing onto regions of said surface a light beam having an intensity of greater than about $10^2$ $W/cm^2$, said regions comprising a pattern to be formed on said surface to be machined said light beam serving to heat the said pattern of regions of said surface to be machined to increase the etching rate of said surface in said regions to provide preferentially machined patterns.

9. A method in accordance with claim 1, 7, 3 or 8 wherein said etching solution comprises:
    20 gm NaCl
    2.5 ml concentrated $H_2SO_4$
    125 ml $H_2O$.

10. A method in accordance with claim 1, 7, 3 or 8 wherein said beam comprises a krypton laser tuned to about 647.1 nm, using about 700 mW of light, focussed to a spot about 170 micrometers in diameter at about $3 \times 10^3$ $W/cm^2$ and said etching solution comprises:
    20 gm NaCl
    2.5 ml concentrated $H_2SO_4$
    125 ml $H_2O$
    and the beam is moved at a rate of about 2 mm/sec.

* * * * *